(12) United States Patent
Dickey et al.

(10) Patent No.: US 9,712,156 B2
(45) Date of Patent: Jul. 18, 2017

(54) SOLID STATE POWER CONTROLLERS

(71) Applicant: Hamilton Sundstrand Corporation, Charlotte, NC (US)

(72) Inventors: John A. Dickey, Caledonia, IL (US); Kevin C. Fritz, Rockford, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 186 days.

(21) Appl. No.: 14/557,103

(22) Filed: Dec. 1, 2014

(65) Prior Publication Data
US 2016/0156348 A1 Jun. 2, 2016

(51) Int. Cl.
*H03K 17/687* (2006.01)
*H03K 17/16* (2006.01)

(52) U.S. Cl.
CPC ......... *H03K 17/687* (2013.01); *H03K 17/163* (2013.01)

(58) Field of Classification Search
CPC .................................................. H03K 17/687
See application file for complete search history.

(56) References Cited

U.S. PATENT DOCUMENTS

| | | | | |
|---|---|---|---|---|
| 5,422,593 A * | 6/1995 | Fujihira | ................. | G05F 1/573 327/427 |
| 6,218,889 B1 * | 4/2001 | Fujiki | .................... | H01L 23/34 257/E23.08 |
| 8,497,728 B2 * | 7/2013 | Mizobe | .................. | H02P 29/02 326/83 |

* cited by examiner

*Primary Examiner* — Hai L Nguyen
(74) *Attorney, Agent, or Firm* — Locke Lord LLP; Scott D. Wofsy; Daniel J. Fiorello

(57) ABSTRACT

A solid state power controller (SSPC) includes a main feed line, a load line, and a P-channel field effect transistor (PCFET) connecting between the main feed line and the load line and including an off state and an on state. The on state electrically connects the main feed line and the load line and the off state electrically disconnects the main feed line and the load line. The SSPC also includes a channel control operatively connected to the PCFET to control the PCFET between the off state and the on state.

9 Claims, 1 Drawing Sheet

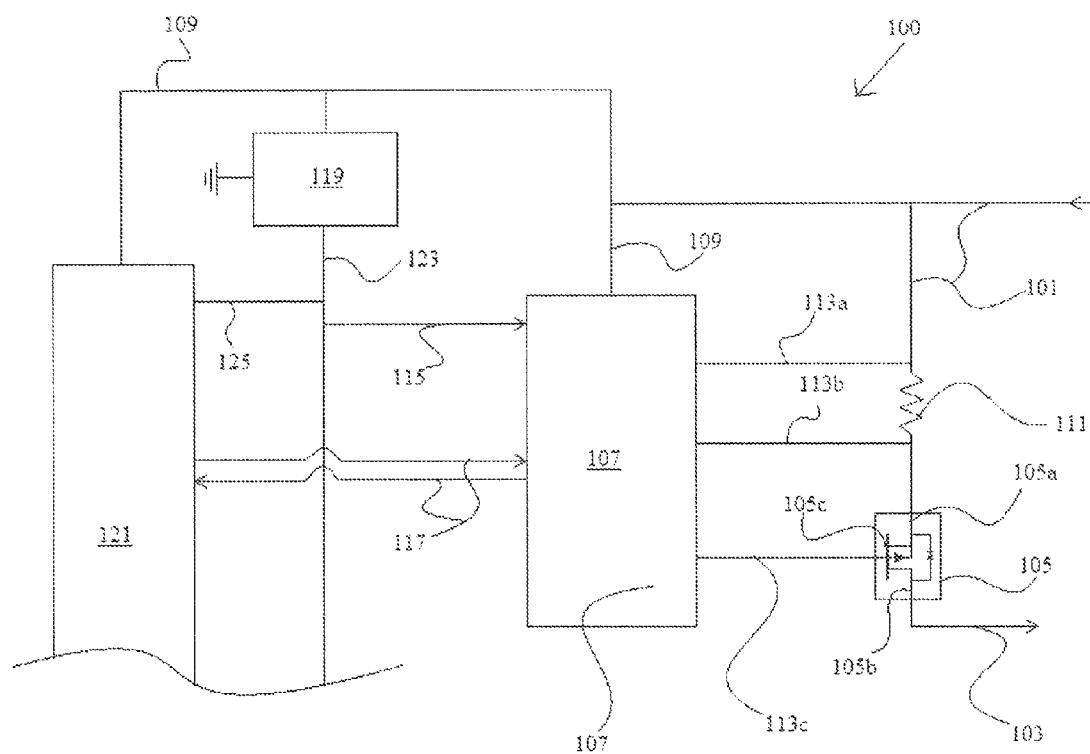

SOLID STATE POWER CONTROLLERS

BACKGROUND

1. Field

The present disclosure relates to power controllers, more particularly to solid state power controllers.

2. Description of Related Art

Traditionally, solid state power controller (SSPC) designs have used floating channel controls referenced to a load line with communications isolators and isolated floating power supplies for each and every channel. This has served its intended purpose even though it has resulted in significant parts count and board space as well as some contribution to power dissipation on the board.

Alternate approaches have used a common positive reference supply for voltage distribution (e.g., 28V) or have used ground as a reference, but have continued to use N-channel field effect transistor (FET) (e.g., MOSFETs) requiring level translation to drive the gate along with an additional gate voltage power supply. Such approaches reduce the isolation components on the communications interface and reduced the number of isolated power supplies but also add level translation, power isolation, and communication isolation circuits for each and every N-channel FET and/or FET group. Also if ground is used as a reference, then level translation for current sensing is also required.

Such conventional methods and systems have generally been considered satisfactory for their intended purpose. However, there is still a need in the art for improved solid state power controllers. The present disclosure provides a solution for this need.

SUMMARY

A solid state power controller (SSPC) includes a main feed line, a load line, and a P-channel field effect transistor (PCFET) connecting between the main feed line and the load line and including an off state and an on state. The on state electrically connects the main feed line and the load line and the off state electrically disconnects the main feed line and the load line. The SSPC also includes a channel control operatively connected to the PCFET to control the PCFET between the off state and the on state.

The main feed line can connect to a source of the PCFET, the load line can be connected to a drain of the PCFET, and the channel control can operatively connect to a gate of the PCFET. The channel control can connect directly to the gate of the PCFET, e.g., without intervening level translation circuitry.

The PCFET can be a metal-oxide semiconductor FET (MOSFET) or any other suitable type of P-channel transistor. The channel control can be operatively connected to the main feed line as a voltage reference.

The SSPC can also include a resistor disposed between the PCFET and the main feed line. The channel control can be operatively connected to sense lines disposed at the resistor. The SSPC can further include a power line operatively connected to the channel control for connecting to a common power source. The power line can be shared and provide control power to multiple SSPCs without multiple isolation circuits needed.

The SSPC can also include a communication line operatively connected to the channel control for connecting to a board controller. The communication line can be a two-way line. The communications line can be directly connected to a board controller instead of requiring isolation for each SSPC. Also, the communications line can be shared and, in such a case, the communications can be multiplexed at the point of isolation (e.g., the board controller).

The SSPC can be connected to a control power and communications that are referenced to main feed line, wherein the control power and communications can be shared by multiple SSPCs without additional or separate isolation from the control power and communications.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain FIGURES, wherein:

the FIGURE is a system view of a solid state power controller in accordance with this disclosure, showing a channel control connected to a P-channel transistor.

DETAILED DESCRIPTION

Reference will now be made to the drawings wherein like reference numerals identify similar structural features or aspects of the subject disclosure. For purposes of explanation and illustration, and not limitation, an illustrative view of an embodiment of a solid state power controller in accordance with the disclosure is shown in the FIGURE and is designated generally by reference character 100. The systems and methods described herein can be used to control power supply to a load while reducing parts count and/or weight of the power controller.

Referring to the FIGURE, a solid state power controller (SSPC) 100 includes a main feed line 101 connectable to a power source (e.g., a battery; not shown), a load line 103 connectable to a load (e.g., an aircraft electrical device; not shown).

The SSPC 100 includes a P-channel field effect transistor (PCFET) 105 connecting between the main feed line 101 and the load line 103. The PCFET 105 includes an off state and an on state. The on state electrically connects the main feed line 101 and the load line 103 thereby allowing electricity to flow through the PCFET 105. The off state electrically disconnects the main feed line 101 and the load line 103, thereby preventing electricity from flowing through the PCFET 105.

The SSPC 100 also includes a channel control 107 operatively connected to the PCFET 105 to control the PCFET 105 between the off state and the on state. The channel control 107 can include any suitable hardware (e.g., a processor) and/or software (e.g., computer code) configured to operate the PCFET 105 between the on state and the off state. Any suitable logic for controlling the PCFET 105 can be utilized by the channel control 107 to control the PCFET.

The main feed line 101 can connect to a source 105a of the PCFET 105 and the load line 103 can connect to a drain 105b of the PCFET 105. The channel control 107 can operatively connect to a gate 105c of the PCFET 105. The channel control can connect directly to the gate of the PCFET 105 via control line 113c. Generally, for a PCFET 105, the source 105a and drain 105b correspond to "p+"

regions and the body portion thereof is an "n" region. The source 105a is the source of the charge carriers (holes for P-channel) that flow through the FET and the drain is where the charge carriers leave the channel. The PCFET 105 can be a metal-oxide semiconductor FET (MOSFET) or any other suitable type of P-channel transistor.

As shown in the FIGURE, the channel control 107 can be operatively connected to the main feed line 101 as a voltage reference via reference line 109. This allows the SSPC 100 to be referenced to the main feed line 101 voltage instead of ground for the purpose of directly controlling the PCFET gate by the controller without the need for isolation or translation.

The SSPC 100 can also include a sense resistor 111 disposed between the PCFET 105 and the main feed line 101 and operatively connected to the channel control via sense lines 103a, 103b. The resistor 111 can be implemented to sense current traveling to the PCFET 105 to allow the controller to turn off the PCFET 105 in an overcurrent surge situation. This allows it to protect the load, the load line 103 to the load, and to protect the SSPC 100 itself. It also allows the channel control 107 to report the current to the load as status information through the communications channel 117.

With the source 105a connected through the sense resistor 111 to the reference, the gate control voltage is no longer dependent on whether the PCFET is on or off and whether the load voltage on load line 103 is active (near the reference voltage) or off (near ground). On traditional 'N' channel type designs, as the gate voltage changed, it also had to track the load voltage in order to maintain the selected state of the FET and output.

The SSPC 100 can further include a power line 115 operatively connected to the channel control 107 to supply control power to the channel control 107. The power line 115 can connect to a common power line 123 which is connected to a common power supply 119 (e.g., a board power supply for board controller 121 connected via board power line 125). As shown, due to the use of a PCFET 105 and common referencing to the main feed line 101, both the board controller 121 and any channel controls 107 associated therewith can use the same common power source 119 without the need for power isolation circuitry between the common power source 119 and the channel control 107.

The SSPC 100 can also include communication lines 117 that are operatively connected to the channel control 107 to provide the channel control 107 with input (e.g., logic) for determining when to operate the gate 105c of the PCFET 105. The communication line can be a two-way line and can be used to provide status of the load and the SSPC. As shown, due to the use of a PCFET 105 and common referencing to the main feed line 101, the channel control 107 can communicate directly with the board controller 121 without the need for communication isolation circuitry between the channel control 107 and the board controller 121.

As described above, the use of common reference throughout an SSPC 100 as well as a P-channel type FET can allow for component reduction in the SSPC 100. Parts count and board area is reduced relative to traditional systems by using a combination of a common line reference for all power, communications, and SSPC 100 functions and by using a P-channel FET because this configuration avoids the need for individual channel isolation and/or level translators that are traditionally needed to drive N-channel MOSFET gates.

The circuit is simplified relative to traditional configurations by referencing to the main feed line voltage and by using a P-channel MOSFET that does not require level translation to float the gate drive relative to the load. This configuration eliminates the parts traditionally required to form the level shifter required for each channel control 107 and still allows a plurality of channel controls 107 to share power and communications on the same reference. The SSPC can be connected to a control power and communications that are referenced to main feed line, wherein the control power and communications can be shared by multiple SSPCs without additional or separate isolation from the control power and communications.

The methods and systems of the present disclosure, as described above and shown in the drawings, provide for SSPC's with superior properties including reduced parts count and/or size. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:
1. A solid state power controller (SSPC), comprising:
a main feed line;
a load line;
a P-channel field effect transistor (PCFET) connecting between the main feed line and the load line and including an off state and an on state, wherein the on state electrically connects the main feed line and the load line, wherein the off state electrically disconnects the main feed line and the load line; and
a channel control operatively connected to the PCFET to control the PCFET between the off state and the on state, wherein the channel control is operatively connected to the main feed line as a voltage reference, and wherein the SSPC is connected to a control power and communications that are referenced to main feed line, wherein the control power and communications can be shared by multiple SSPCs without additional or separate isolation from the control power and communications.

2. The SSPC of claim 1, wherein the PCFET is a metal-oxide semiconductor FET (MOSFET).

3. The SSPC of claim 1, wherein the channel control connects directly to the gate of the PCFET.

4. The SSPC of claim 1, further comprising a resistor disposed between the PCFET and the main feed line.

5. The SSPC of claim 4, wherein the channel control is operatively connected to sense lines disposed at the resistor.

6. The SSPC of claim 1, further including a power line operatively connected to the channel control for connecting to a common power source.

7. The SSPC of claim 1, further including a communication line operatively connected to the channel control for connecting to a board controller.

8. The SSPC of claim 1, wherein the communication line is a two-way line.

9. The SSPC of claim 1, wherein the main feed line connects to a source of the PCFET, wherein the load line connects to a drain of the PCFET, and wherein the channel control operatively connects to a gate of the PCFET.

* * * * *